United States Patent [19]

Ehnholm

[11] Patent Number: 5,250,900
[45] Date of Patent: Oct. 5, 1993

[54] NMR INVESTIGATION OF REPEATED ELECTROMAGNETIC EVENTS

[75] Inventor: Gösta J. Ehnholm, Helsinki, Finland

[73] Assignee: Instrumentarium Corporation, Helsinki, Finland

[21] Appl. No.: 792,782

[22] Filed: Nov. 15, 1991

[30] Foreign Application Priority Data

Mar. 12, 1991 [GB] United Kingdom ............... 9105203

[51] Int. Cl.$^5$ ............................................. G01R 33/20
[52] U.S. Cl. ................................. 324/309; 128/653.2; 324/307
[58] Field of Search ............... 324/307, 300, 309; 128/653.2

[56] References Cited

U.S. PATENT DOCUMENTS

| 4,694,249 | 9/1987 | Post et al. | 324/309 |
| 4,710,717 | 12/1987 | Pelc | 324/309 |
| 4,757,260 | 7/1988 | Tsuda et al. | 324/309 |
| 4,836,209 | 6/1989 | Nishimura | 324/309 |
| 4,891,594 | 1/1990 | Wilfley et al. | 324/309 |
| 4,939,461 | 7/1990 | Kanz | 324/309 |
| 5,042,485 | 8/1991 | Sano et al. | 324/309 |

FOREIGN PATENT DOCUMENTS

| 0273153 | 6/1987 | European Pat. Off. . | |
| 0302742 | 8/1989 | European Pat. Off. . | |
| 8810419 | 12/1988 | World Int. Prop. O. | 324/309 |
| 9002345 | 3/1990 | World Int. Prop. O. . | |
| 9007719 | 7/1990 | World Int. Prop. O. | 324/309 |

OTHER PUBLICATIONS

SMRM 10 (1991) 477–478.
SMRM 7 (1988) 380 & 1094.
SMRM 8 (1989) 329, 816, 817.
SMRM 9 (1990) 121, 612, 617, and 619.
Grucker—Mag. Reson. Med 14: pp. 140–147 (1990).

Primary Examiner—Michael J. Tokar
Assistant Examiner—Raymond Y. Mah
Attorney, Agent, or Firm—Chilton, Alix & Van Kirk

[57] ABSTRACT

A method of nuclear magnetic resonance investigation of a repeated electromagnetic event in a sample comprises modulation of the nuclear spin polarization achieved during the recovery period between the final magnetic resonance signal detection period of one cycle and the initial signal generation RF pulse of the next cycle. This modulation is performed by giving the sample a different exposure to RF radiation in the different periods, for example by exposure to a different number of 180° pulses in each period or by exposure to a frequency modulated continuous wave RF signal.

6 Claims, 1 Drawing Sheet

NMR INVESTIGATION OF REPEATED ELECTROMAGNETIC EVENTS

BACKGROUND OF THE INVENTION

1. Field of the Invention

This invention relates to improvements in and relating to magnetic resonance imaging (MRI) and other NMR diagnostic techniques and in particular to a method of and apparatus for the investigation of time variant electromagnetic events, in particular substantially repetitive events, and especially rapidly variant events such as for example neuronal activity, cardiac activity, etc.

2. Description of the Prior Art

MRI is a diagnostic technique which has rapidly gained favor with physicians but which has tended to be use primarily for generating images of anatomical structures rather than for dynamic imaging of bodily events. Recently however MRI has been used to image blood flow and to produce dynamic images of physical activity, e.g. the heart's pumping action.

Detection of electrical activity in the body is also of particular medical interest. Thus for example the study of cardiac electrical activity may greatly facilitate identification of cardiac dysfunction.

There is thus a need for imaging modalities capable of the spatial and temporal resolution necessary for such investigations.

In MRI the magnetic resonance (MR) signals from which the MR images are generated derive from non-zero spin nuclei (the "imaging nuclei", usually chosen to be protons) within the subject being imaged. The characteristics of the signals depend to a large extent on the electromagnetic environment experienced by the imaging nuclei and any time variance of the electric/magnetic fields experienced by the imaging nuclei due to a localised time variant event, such as evoked neural potentials or cardiac electrical activity, will result in a variation in the degree of polarization of the imaging nuclei and potentially in the magnitude of the detected MR signals.

However in MRI the signal strength of the detected MR signals (the free induction decay (FID) signals) is proportional to the difference between the ground and excited nuclear spin state populations for the imaging nuclei before the excitation/detection cycles of the image acquisition period. For signals to be obtained with reasonable signal:noise ratios there has to be a fairly long delay period between such excitation/detection cycles in order to allow the nuclear spin system to polarise adequately. These delay times are typically of the order of the spin-lattice relaxation time of the imaging nuclei, e.g. of the order of seconds, and as a result the time dependence of the effects of fast repetitive events such as evoked neural potentials, cardiac electrical activity and the like, on the polarization rate is averaged out.

SUMMARY OF THE INVENTION

The present invention makes the time variance of the effects of such events on proton (or other imaging nuclei) polarization rates accessible by sampling the content of different frequencies in the electromagnetic signal of the event under investigation by using the protons themselves as a signal detector whose sensitivity can be externally modulated.

Thus viewed from one aspect the invention provides a method of nuclear magnetic resonance investigation of a repeated electromagnetic event in a sample, said method comprising subjecting said sample to a series of magnetic resonance signal excitation and detection cycles each comprising a nuclear spin polarization generation period, modulaing the nuclear spin polarization in said periods, and generating from the detected magnetic resonance signals an image or signal indicative of the temporal and/or spatial variations of nuclear spin polarization rate resulting from said event.

In the method of the invention the modulation of the spin polarization during the polarization generation periods is most conveniently effected by exposing the sample to 180° RF pulses, the number of such pulses being varied between periods so that the desired image or signal can be produced by Fourier transformation. Alternatively modulation during the polarization generation periods may be achieved in other ways, e.g. by frequency modulation of a continuous wave signal (i.e. what is termed "adiabatic fast passage"), etc.

Thus for example if in successive excitation/detection cycles which are synchronized with the repetition time of the event under investigation the sample is subjected to 0, 1, 2, 3 . . . n 180° RF pulses, the resultant set of signal intensities may be Fourier transformed to yield, for a voxel of interest, the proton relaxation rate as a function of time during the spin polarization generation period, which may be timed to coincide with the event under study.

The indication of spin polarization rate variation, i.e. the protons' reflection of the event under study, may if desired be generated and displayed as a spatial and/or temporal image of the event and the region of the sample in which it occurs or it may simply be generated as a signal for further manipulation or for display in an alternative manner.

The method of the present invention is particularly appropriately performed using MRI apparatus and more especially using MRI apparatus adapted for Overhauser MRI (OMRI) i.e., modification of MRI in which stimulation of electron spin resonance transitions in paramagnetic species in the sample under study is used to enhance the MR signal by virtue of the dynamic nuclear polarization effect. OMRI has been discussed by Leunbach, Lurie and others in for example WO-A-88/10419, Ep-A-355884, WO-A-90/07719, Ep-A-302742, Magn. Reson. Med. 14:140–147 (1990) and in the Abstracts of the Society for Magnetic Resonance in Medicine (SMRM), seventh, eighth and ninth annual meetings 1988, 1989 and 1990.

Thus viewed from a further aspect the prevent invention also provides nuclear magnetic resonance apparatus, preferably MRI or OMRI apparatus, having means for exposing a sample under investigation to a series of magnetic resonance signal excitation/detection cycles each comprising a spin polarization generation period, means arranged to modulate spin polarization during such periods (e.g. means for reversing polarization a selected number of times during such periods), means for detecting magnetic resonance signals from said sample during said cycles, means for generating from said signals an image or signal indicative of temporal and/or spatial variations in spin polarization rate in said sample during said periods, and optionally means arranged to expose said sample to a repeated electromagnetic event during said periods and/or to synchronize said periods with a repeated electromagnetic event.

The temporal resolution of the method of the present invention clearly depends on the length of the spin polarization generation periods and the number of cycles in each event-imaging sequence, or, otherwise put, on the maximum number (n) of modulating 180° RF pulses imposed in the polarization generation periods. Generally a resolution of about 0.5-10 milliseconds may realistically be achieved.

The basic MR imaging technique used in the MR signal excitation/detection cycles in the method of the invention may be one of the conventional techniques, e.g. spin-warp. Thus for example combined with slice selection an x-y-t image can be generated with x-y as spatial dimensions and the measured event providing the third (temporal) t-dimension.

BRIEF DESCRIPTION OF THE DRAWING

The method may be illustrated by reference to the accompanying drawing which shows one timing sequence for image generation according to the invention and considering the example where the event under investigation is cardiac electrical activity.

DESCRIPTION OF THE PREFERRED EMBODIMENTS

Figure 1:
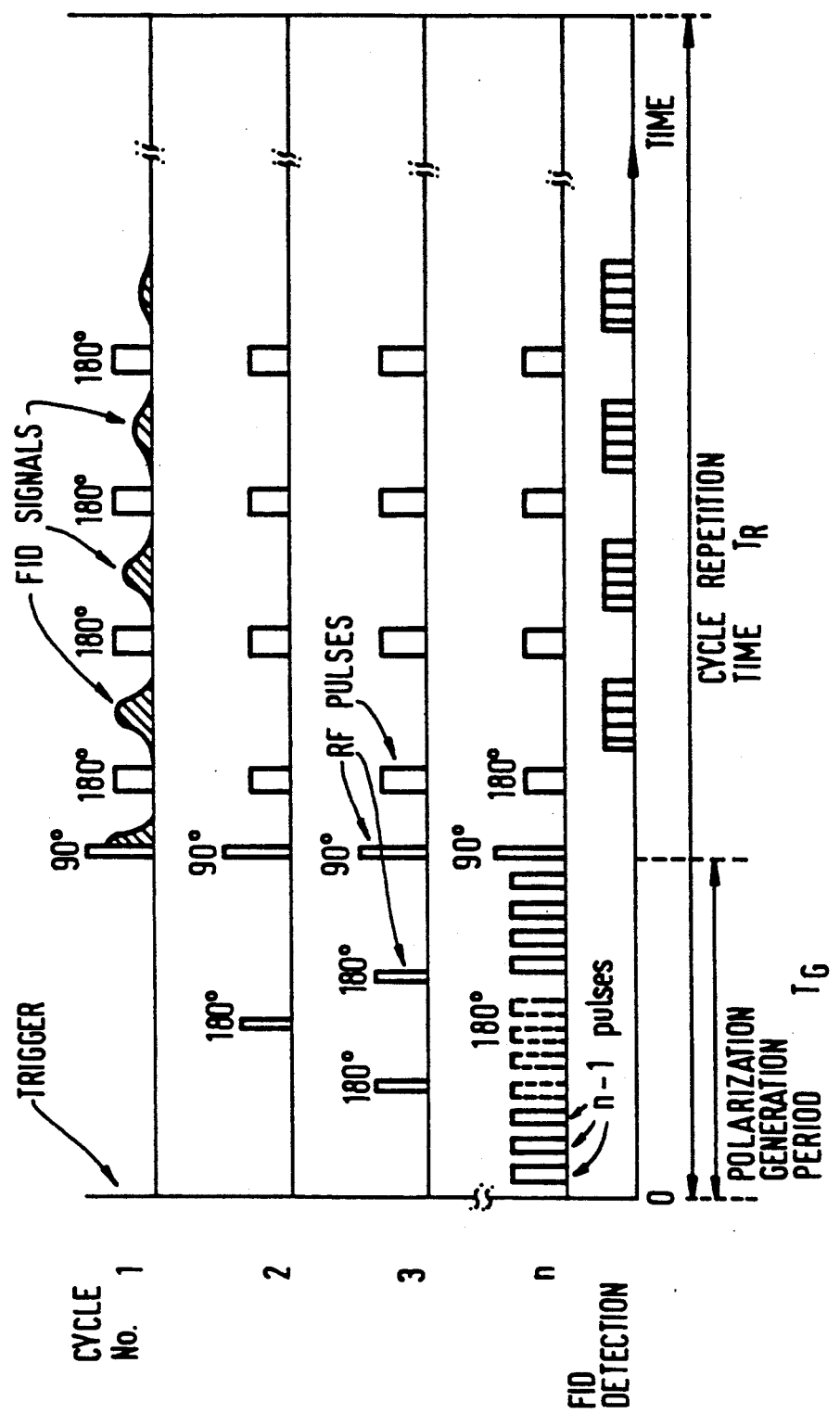

Turning to the drawing, this shows schematically the imposition of 0, 1, 2 ... n 180° RF modulating pulses in the spin polarization generation period Tg which starts each excitation/detection cycle. The heart's electrical activity is cyclical and an electrocardiogram can therefore be used to trigger each cycle thereby ensuring that the period Tg in successive cycles corresponds to the same phase of cardiac activity. The position and length of Tg in the cardiac activity phase is selected and subsequently divided into a number n+1 (generally $2^m$) of parts, the number, e.g. 16, and length, e.g. 100 ms, being chosen to obtain the desired time resolution. At the beginning of each cycle, polarization generation begins quite naturally from about zero (its value as a result of the previous cycle). In one cycle no 180° RF pulse is applied during Tg, in the next one 180° RF pulse is applied in the middle of Tg, in the next two evenly spaced 180° RF pulses are applied at $\frac{1}{4}$Tg and $\frac{3}{4}$Tg, in the next three evenly spaced pulses and so on. (For generation of an N ×N pixel image a set of N×n such cycles would be required).

The polarization of the end of Tg is read out by standard methods, e.g. using a 90° RF pulse and subsequent echo generation pulses, which will automatically destroy the polarization generated during Tg.

For the first cycle (no 180° RF modulating pulse) the proton polarization read out corresponds to that that could be built up during Tg. For the second cycle the proton polarization at the end of Tg is proportional to the difference between the average relaxation rate during the first and second halves of Tg, i.e. to the harmonic content of the signal corresponding to the frequency 2f having one cycle in Tg. For the third period the content of 3f is measured and so on. The time dependence of the relaxation rate can then finally be obtained by Fourier transforming the measured values using standard techniques.

If the technique is performed using OMRI techniques, then electron spin resonance stimulation will generally also be effected during the periods Tg.

Where the overall cycle repetition time is relatively large, e.g. 0.8-3 seconds, as would be the case with cardiac imaging, the method of the invention will preferably be used with a so-called fast-imaging technique, for example one of the echo planar imaging techniques.

The method of the present invention allows localised electrical activity to be detected or imaged, e.g. membrane potentials, neuronal firing etc. In particular it allows the possibility of mapping the motion of the action potential of the heart. This would permit the physician to determine whether or not cardiac function is normal and to locate any functional abnormality.

I claim:

1. A method of nuclear magnetic resonance investigation of a repeated electromagnetic event in a sample, said method comprising subjecting said sample to a series of magnetic resonance signal excitation and detection cycles, each cycle comprising a nuclear spin polarization generation period, exposing said sample to RF radiation during said periods and varying the exposure of the sample to said radiation from period to period to thereby modulate the nuclear spin polarization achieved in said periods, and generating from the detected magnetic resonance signals a further signal indicative of variations of nuclear spin polarization rate resulting from said event, said variations being selected from temporal and spatial variations.

2. A method as claimed in claim 1 wherein modulation of the spin polarisation during polarisation generation periods is effected by exposing the sample to 180° RF pulses with the number of said pulses being varied between said periods and with image or signal generation being effected by a Fourier transformation technique.

3. A method as claimed in claim 1 wherein modulation of the spin polarization during polarization generation periods is effected by exposing the sample to a frequency modulated continuous wave RF signal.

4. Nuclear magnetic resonance apparatus comprising means for exposing a sample under investigation to a series of magnetic resonance excitation/detection cycles, each cycle comprising a spin polarization generation period, means for exposing said sample during said periods to RF radiation and for varying the exposure to said radiation from period to period to thereby modulate the nuclear spin polarization achieved during such periods, means for detecting magnetic resonance signals from said sample during said cycles, and means for generating a further signal indicative of variations in spin polarization rate in said sample during said periods from said detected magnetic resonance signals, said variations in spin polarization rate being selected from temporal and spatial variations.

5. Apparatus as claimed in claim 4 further provided with means arranged to expose said sample to a repeated electromagnetic event during said spin polarisation generation periods.

6. Apparatus as claimed in claim 4 further provided with means arranged to synchronise said spin polarisation generation periods with a repeated electromagnetic event.

* * * * *